United States Patent
Matsuda

(10) Patent No.: US 7,268,439 B2
(45) Date of Patent: Sep. 11, 2007

(54) SEMICONDUCTOR DEVICE HAVING RESIN-SEALED AREA ON CIRCUIT BOARD THEREOF

(75) Inventor: Shuichi Matsuda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/447,148

(22) Filed: Jun. 6, 2006

(65) Prior Publication Data

US 2006/0231936 A1 Oct. 19, 2006

Related U.S. Application Data

(62) Division of application No. 10/106,495, filed on Mar. 27, 2002, now Pat. No. 7,084,511.

(30) Foreign Application Priority Data

Mar. 27, 2001 (JP) .............................. 2001-89258

(51) Int. Cl.
*H01L 23/28* (2006.01)
(52) U.S. Cl. ................ 257/787; 257/735; 257/E23.066
(58) Field of Classification Search ................ 257/675, 257/692, 706, 735, 738, 787, E23.066, E23.178; 361/709, 719
See application file for complete search history.

(56) References Cited

U.S. PATENT DOCUMENTS

| | | | |
|---|---|---|---|
| 4,467,345 A | 8/1984 | Ozawa | |
| 5,026,669 A | 6/1991 | Shinohara | |
| 5,057,805 A | 10/1991 | Kadowaki | |
| 5,172,301 A | 12/1992 | Schneider | |
| 5,198,693 A | 3/1993 | Imken et al. | |
| 5,276,584 A | 1/1994 | Collins et al. | |
| 5,287,247 A | 2/1994 | Smits et al. | |
| 5,382,546 A | 1/1995 | Yamada et al. | |
| 5,409,865 A | 4/1995 | Karnezos | |
| 5,422,163 A | 6/1995 | Kamiyama et al. | |
| 5,428,373 A | 6/1995 | Shiraishi et al. | |
| 5,444,303 A | 8/1995 | Greenwood et al. | |
| 5,468,994 A | 11/1995 | Pendse | |
| 5,497,030 A | 3/1996 | Takeuchi | |
| 5,780,933 A | 7/1998 | Ohmori et al. | |
| 5,877,937 A | 3/1999 | Shibata et al. | |
| 5,889,654 A | 3/1999 | Pierson et al. | |
| 5,903,052 A | 5/1999 | Chen et al. | |

(Continued)

FOREIGN PATENT DOCUMENTS

JP 401241850 9/1989

(Continued)

*Primary Examiner*—Hoai Pham
(74) *Attorney, Agent, or Firm*—Young & Thompson

(57) ABSTRACT

A semiconductor device having a molded sealing resin for sealing a semiconductor chip on a circuit board thereof reduces resin burrs resulting from the leakage of the sealing resin, and also restrains the occurrence of disconnection caused by a wiring layer being crushed. In the semiconductor device, the sealing resin for sealing the semiconductor chip is molded on the circuit board that has a plurality of wiring patterns and a solder resist for insulatively covering the wiring patterns formed on the front surface thereof, the interval of the wiring patterns is set to range from 50% to 200% of its adjacent interval in a molding line area of the sealing resin.

7 Claims, 15 Drawing Sheets

U.S. PATENT DOCUMENTS

| | | |
|---|---|---|
| 5,904,506 A | 5/1999 | Yoneda et al. |
| 5,949,134 A | 9/1999 | Yanagisawa |
| 6,066,888 A | 5/2000 | Yanagisawa |
| 6,114,192 A | 9/2000 | Tsunoda et al. |
| 6,198,165 B1 | 3/2001 | Yamaji et al. |
| 6,198,522 B1 | 3/2001 | Yanagi |
| 6,222,738 B1 | 4/2001 | Maeno et al. |
| 6,259,157 B1 | 7/2001 | Sakamoto et al. |
| 6,282,094 B1 | 8/2001 | Lo et al. |
| 6,365,979 B1 | 4/2002 | Miyajima |
| 6,395,582 B1 | 5/2002 | Sohn et al. |
| 6,465,745 B1 | 10/2002 | Fontacha et al. |
| 6,466,446 B1 | 10/2002 | Nagy et al. |
| 6,504,239 B1 | 1/2003 | Yamada |
| 6,515,356 B1 * | 2/2003 | Shin et al. ............ 257/678 |
| 6,650,012 B1 | 11/2003 | Takahashi |
| 6,686,226 B1 | 2/2004 | Tsunoda et al. |
| 2001/0005060 A1 | 6/2001 | Ohuchi et al. |
| 2001/0005311 A1 | 6/2001 | Duesman et al. |
| 2001/0015492 A1 | 8/2001 | Akram et al. |
| 2001/0025721 A1 | 10/2001 | Maeda et al. |
| 2001/0033015 A1 | 10/2001 | Corisis |
| 2001/0055203 A1 | 12/2001 | Asai et al. |
| 2002/0030259 A1 | 3/2002 | Choi et al. |
| 2002/0079592 A1 | 6/2002 | Lo et al. |

FOREIGN PATENT DOCUMENTS

| | | |
|---|---|---|
| JP | 403050854 | 3/1991 |
| JP | 404364740 | 12/1992 |
| JP | 407030037 | 1/1995 |
| JP | 9-219470 | 8/1997 |
| JP | 11-317472 | 11/1999 |
| JP | 2000-114426 | 4/2000 |

* cited by examiner

SEMICONDUCTOR DEVICE HAVING RESIN-SEALED AREA ON CIRCUIT BOARD THEREOF

This is a divisional of application Ser. No. 10/106,495 filed Mar. 27, 2002, now U.S. Pat. No. 7,084,511.

BACKGROUND OF THE INVENTION

1. Field of the Invention

The present invention relates to a semiconductor device in which the surface of a circuit board thereof is resin-sealed together with a semiconductor chip thereof and, more particularly, to a semiconductor device that restrains degradation of the reliability of the semiconductor device by resin sealing.

2. Description of the Related Art

With the trend toward a thinner semiconductor device with more pins, there has been proposed a semiconductor device having a ball grid array (BGA) structure (hereinafter referred to as the "BGA type semiconductor device"). In the BGA type semiconductor device, a semiconductor chip is mounted on a circuit board, and solder balls provided on the circuit board serve as external connection terminals. This arrangement makes it possible to control the thickness of the package to about the thickness of the circuit board and to allow numerous solder balls to be arranged at high density, thus permitting the demand for a reduced thickness and an increased number of pins to be met. An example of such a BGA type semiconductor device with solder balls arranged on the rear surface of the circuit board thereof is disclosed in, for instance, Japanese Unexamined Patent Publication No. 11-317472 or Japanese Unexamined Patent Publication No. 9-219470. Regarding these BGA type semiconductor devices, a problem is described in that a molding resin runs off through a gap between a metal mold and a wiring board in the vicinity of a visible outline (molding line) of a molding resin layer in the peripheral portion of the circuit board, and resin burrs occur, adversely affecting the step for cutting the circuit board to for each semiconductor device. To restrain the occurrence of the resin burrs, according to the art disclosed in the former publication, solder resists 1 and 2 are layered along the molding line, as shown in FIG. 1, and the gap between the circuit board and the metal mold is closed by a solder resist 3 formed of the two layers so as to prevent the resin from leaking out. According to the art disclosed in the latter publication, a dam frame 12 constructed of a dummy wire and a resin layer or only a resin layer is formed along a molding line, as shown in FIG. 2, and the gap between a circuit board 11 and a cope 14 is closed by the dam frame 12 so as to prevent a resin 13 from leaking out.

However, the art in which the laminated solder resist or the dam frame is formed to close the gap between the circuit board and the metal mold requires the step for forming such a laminated solder resist or dam frame, leading to increased cost of the semiconductor device attributable to the additional step. Furthermore, unless the laminated solder resist or the dam frame is formed along the molding line of a sealing resin, the leakage of a resin cannot be effectively prevented. For this reason, therefore, it is necessary to position the laminated solder resist or the dam frame with high accuracy to form them. A smaller semiconductor device, in particular, requires high positioning accuracy, making it more difficult to fabricate the semiconductor device and also making the manufacturing process more complicated.

In recent years, there has been proposed a semiconductor device in which solder balls are disposed on the front surface of the circuit board thereof so as to allow a heat spreader or a heat sink to be disposed on the rear surface of the circuit board, thereby enhancing the heat radiation performance of the semiconductor device to improve the characteristics of the semiconductor device. Such a semiconductor device is referred to as an enhanced ball grid array (EBGA). In the present specification, the device is referred to as an advanced ball grid array type semiconductor device (ABGA).

FIG. 3 is a partially cutaway top plan view showing a conventional ABGA type semiconductor device; FIG. 4 is an enlarged top plan view of an area S2 of the ABGA type semiconductor device shown in FIG. 3; and FIG. 5 is an enlarged sectional view of the area S2, a part of which along the line D-D shown in FIG. 4 has been omitted. A circuit board 401 formed of multiple layers, the details of which are omitted, is attached onto the front surface of a heat spreader composed of a metal plate material, not shown, and a semiconductor chip 405 is mounted on the front surface of the heat spreader in an opening 411 provided at the center of the circuit board. The semiconductor chip 405 is electrically connected by bonding wires 406 to a bonding pad 426 formed on one end of each of multiple wiring patterns HP constructed of a wiring layer 421 formed on the front surface of the circuit board 401. The wiring layer 421 is electrically connected to a wiring layer, not shown, under the circuit board 401 via through holes 425, and also insulatively covered by a solder resist 415 provided on the front surface of the circuit board 401. In addition, a sealing resin 403 is molded to cover the semiconductor chip 405, the bonding wires 406, etc. To perform the molding, the circuit board 401 on which the semiconductor chip 405 has been mounted as described above is set on a resin molding apparatus, a metal mold is disposed so as to vertically clamp the circuit board 401, and a sealing resin is injected into the metal mold and cured, thus effecting the molding. A ball pad 427 formed on the other end of each of the wiring patterns HP is disposed in the peripheral portion of the front surface of the circuit board 401, which is free of the sealing resin 403 of the circuit board 401. Solder balls 404 are formed on the ball pad 427.

The conventional ABGA type semiconductor device set forth has been posing the following problems. First, during the molding of the sealing resin 403, a part of the resin flows out along the front surface of the circuit board 401 to the peripheral portion thereof and cures. Hence, as shown in FIG. 3 illustrating an example, a resin burr X facing toward the outer periphery occurs from a molding line ML, which is the external line of the sealing resin and which coincides with the line along the above line D-D in this case. Especially if the resin flows out to the area wherein the ball pads 427 are formed, the resin burrs X will be formed on the front surface of the ball pads 427. If such resin burrs are produced, the resin burrs X prevents metal materials for forming the solder balls 404 from being formed on the surfaces of the ball pads 427 in the step for forming the solder balls 404 on the ball pads 427. Even if the solder balls 404 are formed, the solder balls 404 may come off during a subsequent step or during transportation or the like.

Second, when the molding of the sealing resin 403 is carried out, in the portion along the visible outline of the sealing resin 403, that is, the molding line ML, the wiring layer 421 constituting the wiring patterns HP is crushed in the direction of the thickness and the wiring layer 421 may be disconnected in an extreme case.

Thus, the conventional ABGA type semiconductor device as been presenting a problem in that defects such as poor connection of the solder balls, the disconnection of the wiring layer, or the like takes place, resulting in a lower manufacturing yield of the semiconductor devices and degraded reliability of the semiconductor devices.

The present inventor has studied to identify the causes for such problems, and found the following. Referring back to FIG. 3 showing the conventional ABGA type semiconductor device, the multiple wiring patterns HP formed on the front surface of the circuit board are linearly extended between the wiring layers so as to minimize the wiring length between the bonding pads 426, which are connected by the bonding wires 406 to the semiconductor chip 405, and the ball pads 427 whereon the solder balls 404 are to be formed. There is a difference in the number of the wiring patters HP per unit area between the areas along the four sides and the areas in the four corners of the rectangular circuit board 401. In general, more ball pads can be formed in the areas at the four corners, so that more wire patterns HP are formed. For these reasons, in the case of the configuration example shown in FIG. 6, wiring patterns HP11 through HP15 will have a dense area wherein adjacent wiring patterns have a small interval dimension d1 and a sparse area wherein adjacent wiring patterns have a large interval dimension d2. As a result, in contrast to the area wherein the wiring patterns HP11 through HP15 are dense, the front surface of the solder resist 415 in the area wherein the wiring patterns are sparse is relatively concaved on the front surface of the circuit board 401, as shown in FIG. 3.

Accordingly, the circuit board having the solder resist 415 with the uneven surface due to the uneven density of the wiring patterns poses the problem described below when sealing the semiconductor chip or the like mounted thereon by a sealing resin. As shown by the sectional view of FIG. 6 taken along the same molding line ML as that shown in FIG. 5, when the circuit board is clamped between a cope UK and a drag DK in a resin molding apparatus, the solder resist 415 is slightly crushed and become even in the area wherein the wiring patterns are dense, bringing the front surface of the solder resist 415 into close contact with the cope UK, while a gap SP is produced between the front surface of the solder resist 415 and the cope UK in the area wherein the wiring patterns are sparse. Hence, when a resin is injected into the cavity of the metal mold to effect the molding, a part of the resin leaks out beyond a sealing area through the gap SP, and flows out beyond the molding line ML on the circuit board 401 as mentioned above into the area of the neighboring ball pads 427. The resin leaking out turns into the resin burr X when it cures.

There is another problem. At the time of the sealing resin molding, when circuit board is clamped between the cope UK and the drag DK, the clamping force causes the circuit board 401 to be subjected to a load in the direction of the thickness thereof. At this time, the load is dispersed to many wiring patterns in the area wherein the wiring patterns HP are dense, so that the load applied to each wiring pattern is reduced, while the load applied to each wiring pattern is relatively higher in the area wherein the wiring patterns are sparse, because the load is scattered less in the sparse area. Therefore, the wiring patterns in the area with sparse wiring patterns will be crushed in the direction of the thickness thereof by the load, resulting in a reduced thickness of the wiring patterns. This leads to an increase in the electrical resistance or disconnected wiring patterns in some cases.

SUMMARY OF THE INVENTION

Accordingly, it is an object of the present invention to provide a semiconductor device that permits easy manufacture of a semiconductor device having a sealing resin molded to seal a semiconductor chip onto a circuit board, and that reduces resin burrs caused by leakage of a sealing resin and also restrains the occurrence of disconnection attributable to a crushed wiring layer.

A semiconductor device according to the present invention includes a circuit board having a plurality of wiring patterns and a solder resist layer for insulatively covering the wiring patterns that are formed at least on the front surface thereof, a semiconductor chip electrically connected to the wiring patterns, and a sealing resin molded to seal the semiconductor chip onto the front surface of the circuit board, wherein the wiring patterns in an area along the periphery of the sealing resin are formed such that an wiring pattern interval ranges from 50% to 200% of its adjacent wiring pattern interval. In this case, one end of each of the wiring patterns is electrically connected to the semiconductor chip, while the other end thereof is extended from inside the sealing resin to outside thereof and connected to an external connecting electrode at the other end side.

According to a first embodiment, the circuit board has a heat spreader integrally formed on the rear surface therewith and an opening formed in a central area thereof. In the opening, the semiconductor chip is mounted on the heat spreader and electrically connected to one end of each of the wiring patterns. In an outer peripheral area of the sealing resin on the front surface of the circuit board, an electrode for external connection is disposed at the other end of each of the wiring patterns. Alternatively, the semiconductor chip is mounted on the central area of the front surface of the circuit board and electrically connected to one end of each of the wiring patterns, and in the outer peripheral area of the sealing resin on the front surface of the circuit board, the electrode for external connection is disposed at the other end of each of the wiring patterns.

According to a second embodiment, dummy wiring patterns are provided among the plurality of wiring patterns, and the interval between adjacent wiring patterns and the interval between the wiring pattern and dummy wiring pattern range from 50% to 200%. In this case, the dummy wiring patterns are preferably connected to a fixed potential. For instance, the circuit board has a multilayer wiring structure, a power wiring layer and a fixed potential wiring layer, such as a ground wiring layer, being formed as intermediate layers. The fixed potential wiring layer is electrically connected to the dummy wiring patterns via through holes.

A semiconductor device according to a third embodiment of the present invention includes a circuit board that has the semiconductor chip mounted on the front surface thereof and electrically connected to the wiring pattern, and electrodes for external connection that are electrically connected to the wiring patterns via through holes being disposed on the rear surface thereof. The interval between adjacent wiring patterns and the interval between the wiring pattern and dummy wiring pattern range from 50% to 200%. In this case, the dummy wiring patterns are preferably connected to a fixed potential. For instance, the circuit board has a multilayer wiring structure, a power wiring layer and a fixed potential wiring layer, such as a ground wiring layer, being formed as intermediate layers. The fixed potential wiring layer is electrically connected to the dummy wiring patterns via through holes.

In the present invention, the interval dimension between the adjacent ones of the plurality of wiring patterns ranges from 50% to 200%. Hence, between the wiring patterns, no gap will be produced between a clamping portion of a metal mold applied to a circuit board and the front surface of the circuit board when molding a sealing resin onto the front surface of the circuit board. Therefore, when a sealing resin is injected into the cavity of the metal mold to mold the sealing resin, no major resin leakage will result, thus restraining the occurrence of poor connection of solder balls or disconnection of wiring layers. In addition, when a load is applied to the wiring patterns in a molding line area by the clamping force of the metal mold, the load is applied such that it is evenly scattered to the individual wiring patterns, thus preventing the wiring patterns from being crushed and disconnected by the metal mold.

DESCRIPTION OF THE PREFERRED EMBODIMENTS

Referring to the accompanying drawings, a first embodiment of the present invention will be explained in detail.

Figure 7:
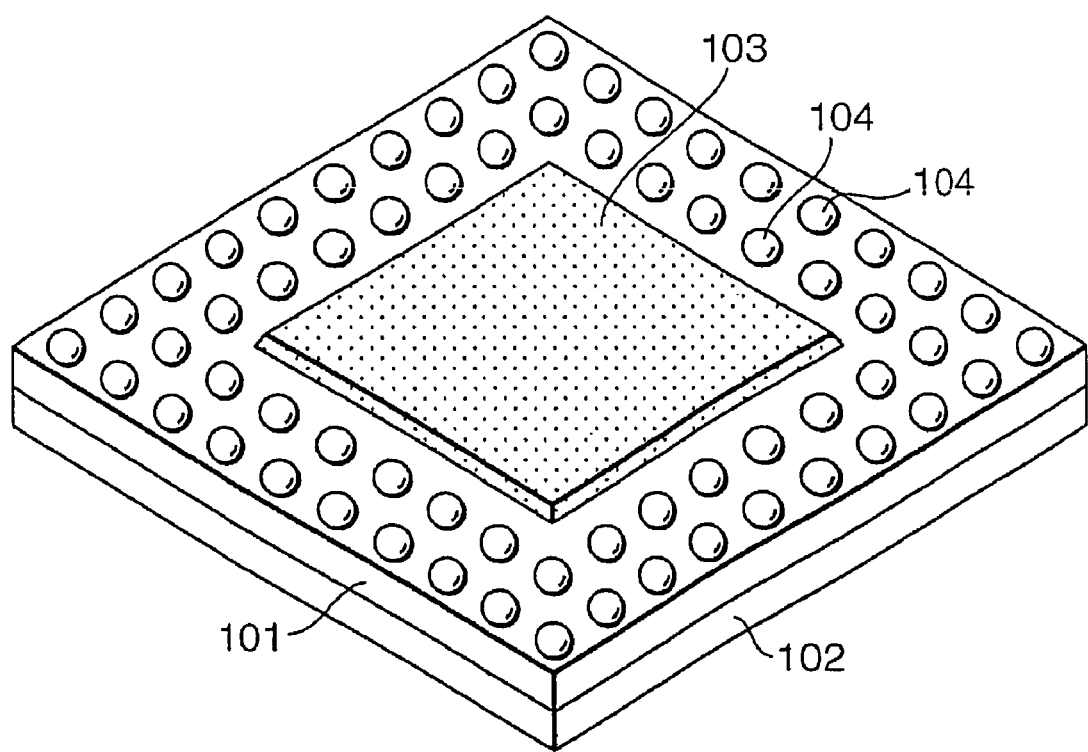
FIG. 7 is a schematic perspective view of a first embodiment of a semiconductor device in accordance with the present invention.
Figure 8:
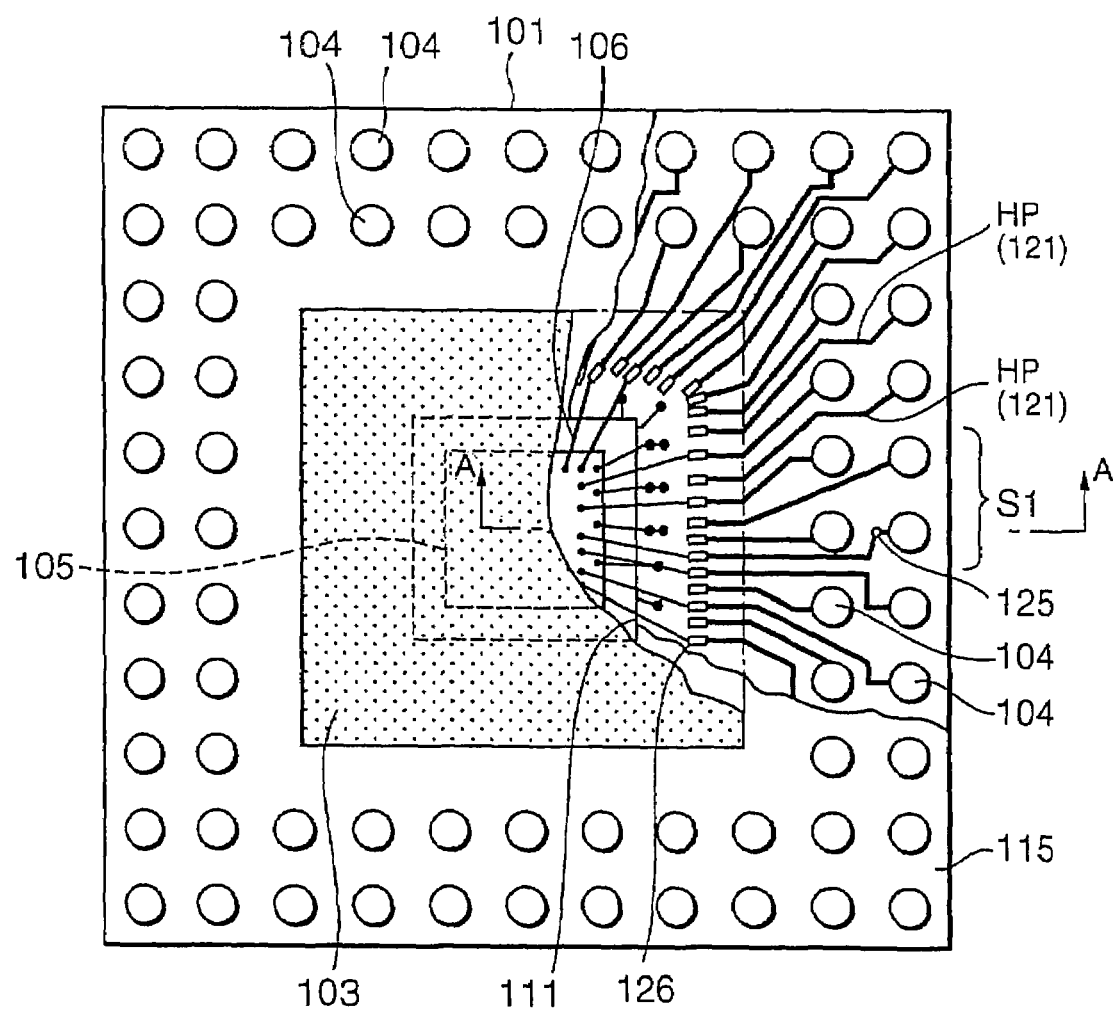
FIG. 8 is a partly cutaway plan view of the semiconductor device shown in FIG. 7.
Figure 9:
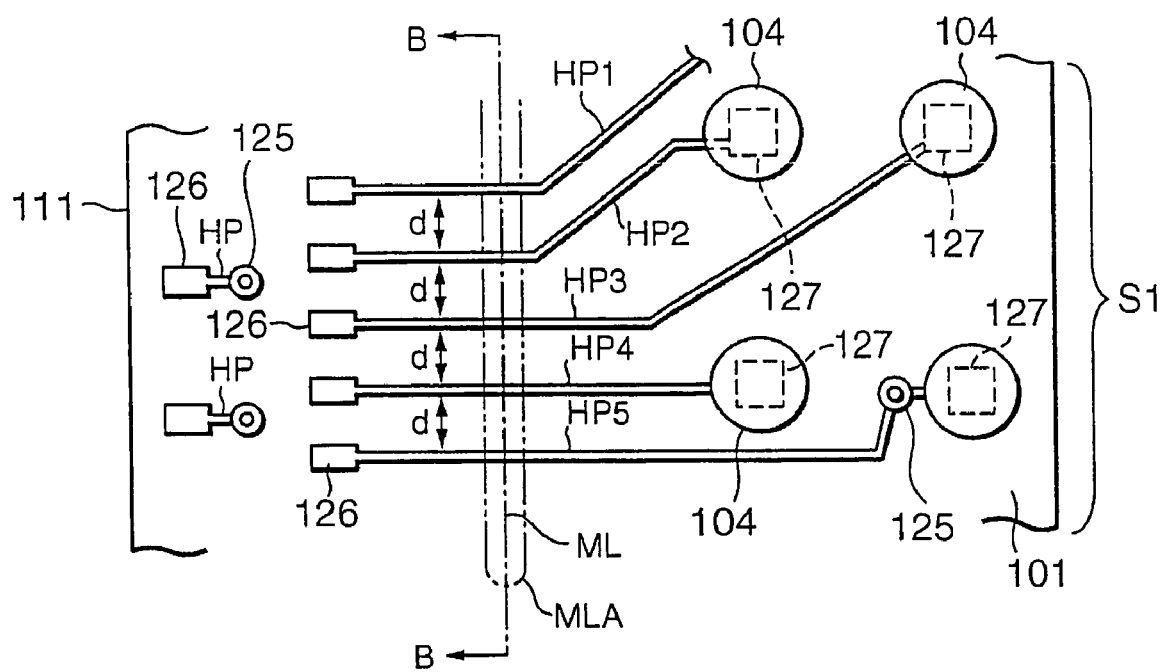
FIG. 9 is an enlarged plan view of an essential section of the semiconductor device shown in FIG. 8.
Figure 10:
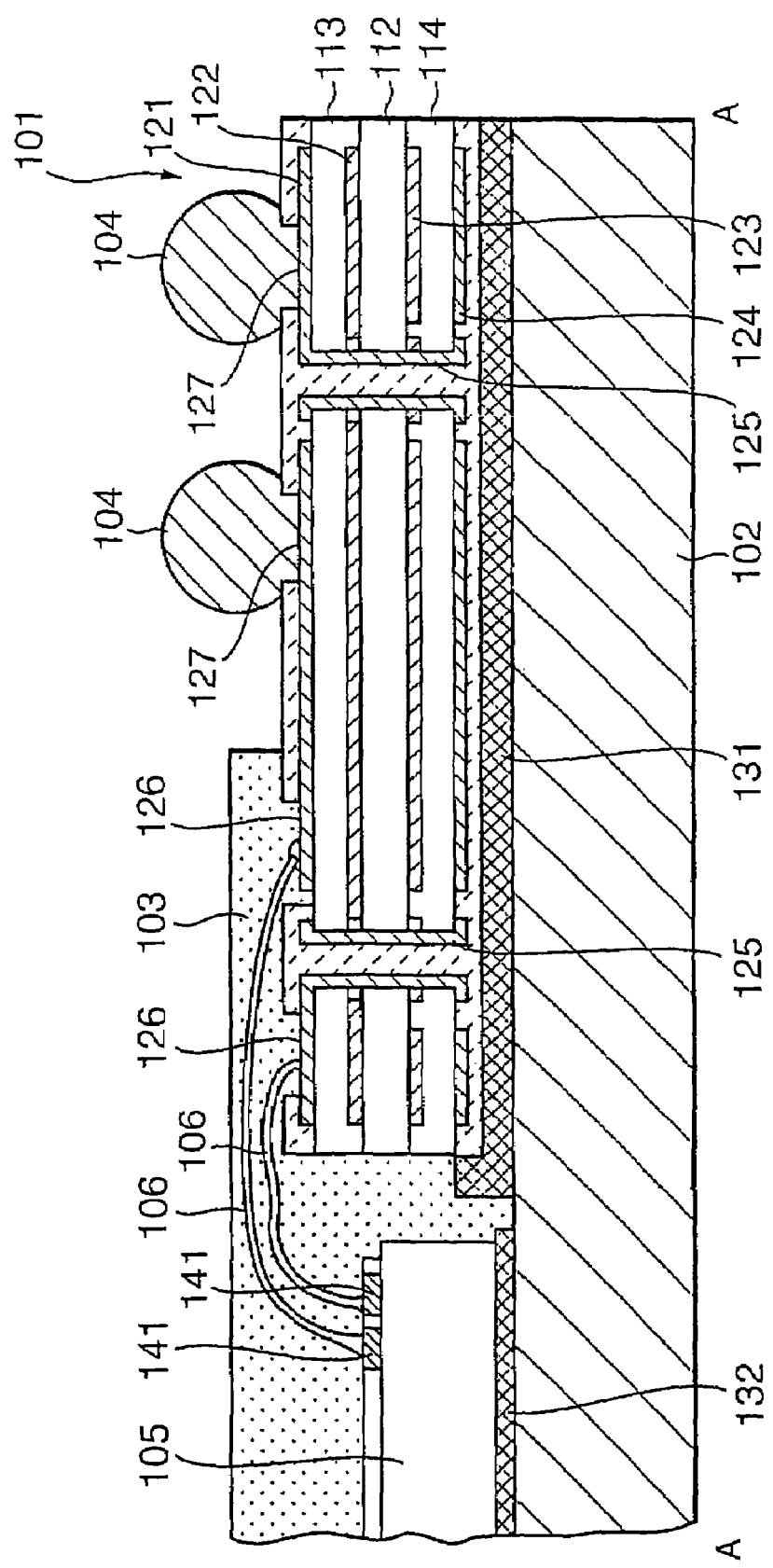
FIG. 10 is an enlarged sectional view taken at the line A-A shown in FIG. 8.
Figure 11:
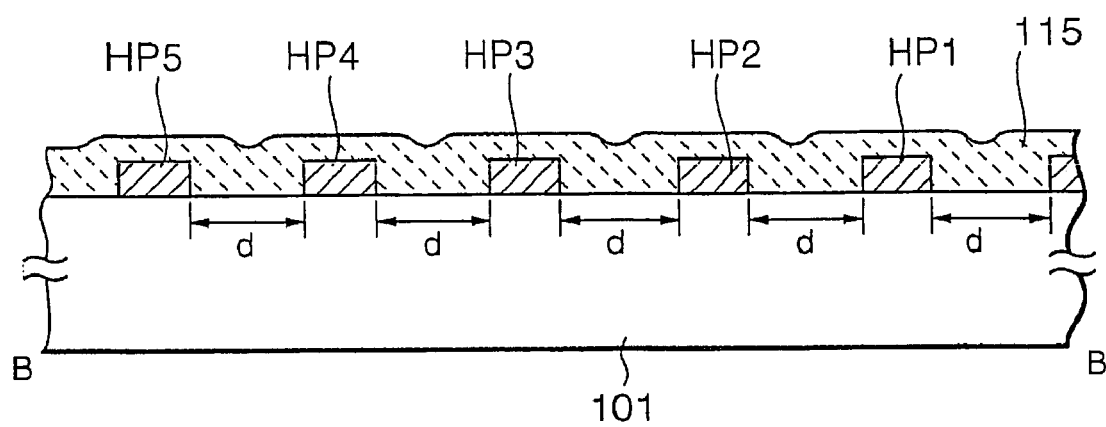
FIG. 11 is an enlarged sectional view wherein an area S1 along the line B-B shown in FIG. 9 has been omitted.

FIG. 7 is a schematic perspective view of an embodiment in which the present invention has been applied to an ABGA type semiconductor device; FIG. 8 is a plan view of the semiconductor device with a part of a sealing resin cut away; FIG. 9 is an enlarged plan view of an essential area S1 shown in FIG. 8; FIG. 10 is an enlarged sectional view taken at the line A-A shown in FIG. 8; and FIG. 11 is an enlarged sectional view wherein a part along the line B-B shown in FIG. 9 has been omitted.

Referring to FIG. 7, the ABGA type semiconductor device has a heat spreader 102 integrally attached to the bottom surface of a circuit board 101, the heat spreader 102 being constructed of a metal plate having high thermal conductivity. A molded sealing resin 103 is provided in the central area of the circuit board 102 to seal a semiconductor chip or the like, which will be discussed hereinafter. In the peripheral area of the front surface of the circuit board 101, a number of solder balls 104 are arranged in a grid pattern. This ABGA type semiconductor device is mounted on a printed circuit board (not shown) by a surface mounting process, in which the front surface with the solder balls 104 formed thereon is disposed to oppose the front surface of the printed circuit board, and the solder balls 104 are heated to melt them so as to connect them to wiring patterns of the printed circuit board. In this mounting condition, the heat generated by the sealed semiconductor chip is efficiently radiated by the heat spreader 102.

Referring now to FIG. 8 through FIG. 10, the circuit board 101 is formed to have a planar shape similar to a square shape that has the same outside dimensions as those of the heat spreader 102. An opening 111, which is slightly larger than the semiconductor chip, which will be discussed hereinafter, is formed in a central area of the circuit board 101. The circuit board 101 in this embodiment is formed to have a four-layer wiring structure. More specifically, thin metal films are attached to both surfaces of a core 112 composed of an insulating plate of a glass epoxy resin or the like, and patterns are formed on the thin metal films by lithography so as to form wiring layers 122 and 123 having desired wiring patterns. Furthermore, prepregs 113 and 114, which are made of thin resin films, and thin metal films are mounted on the front surfaces of the wiring layers 122 and 123, then cured to form them into one piece. Thereafter, the thin metal films are patterned by lithography to produce wiring layers 121 and 124. Thus, a total of four layers are formed at top and bottom so that they are insulated against each other, the core 112 and the prepregs 113 and 114 being interleaved thereamong.

The first wiring layer 121, the second wiring layer 122, the third wiring layer 123, and the fourth wiring layer 124 are stacked in this order from the top. Of the wiring layers, the uppermost first wiring layer 121 is configured as a signal wiring layer. Other layers, such as the second wiring layer 122 is configured as a signal wiring layer, the third wiring layer 123 is configured as a power wiring layer, and the fourth wiring layer 124 is configured as a ground wiring layer.

The through holes 125 are provided at predetermined locations of the circuit board 101, and the first through fourth wiring layers 121 through 124 are electrically interconnected by the through holes 125. Furthermore, a solder resist 115 made of an insulating material is applied to the front and rear surfaces of the circuit board 101, that is, on the surfaces of the first wiring layer 121 and the fourth wiring layer 124 to insulatively protect the surfaces of the wiring layers 121 and 124.

Referring to FIG. 8 and FIG. 9, the first wiring layer 121 is formed of a large number of short or long narrow wiring patterns HP extended from one end of each, which is disposed on a peripheral edge of the opening 111 in the central area of the circuit board 101, toward the other end of each and toward the peripheral direction of the circuit board 101. The wiring patterns HP of the first wiring layer 121 are formed to have the same width substantially over the full lengths; however, one end of each is formed to have a slightly larger wire width, and the solder resist 115 is removed from the area of one end of each to expose the front surface of the first wiring layer 121 so as to provide a bonding pad 126. The other end of each of the wiring patterns HP is formed to have a further larger wire width, and the solder resist 115 is removed from the other end of each to expose the front surface of the first wiring layer 121 so as to provide a ball pad 127. Of the wiring patterns HP, one end of each of shorter wiring patterns HP is disposed along an inner line, while one end of each of longer wiring patterns HP is disposed along an outer line. Thus, the bonding pads 126 are arranged in two rows along the periphery of the opening 111.

Similarly, of the wiring patterns HP, the other end of each of shorter wiring patterns HP is terminated by the through hole 125 and electrically connected to a lower wiring layer. On the other hand, the other end of each of longer wiring patterns HP is formed as the ball pad 127. All the ball pads 127 are arranged in a plurality of rows (two rows in this case) in a grid pattern along the outer periphery of the circuit board 101.

Furthermore, the longer ones among the wiring patterns HP are extensively disposed such that the linear portions thereof are extended as much as possible between the bonding pads 126 and the ball pads 127. For this reason, the intervals of the wiring patterns HP are not necessarily even in the areas near the bonding pads 126 or the ball pads 127. In the area along the outer periphery of the sealing resin 103 on the circuit board 101, that is, an area MLA having a predetermined width indicated by the two-dot chain line (hereinafter referred to as the "molding line area") and extending along a molding line ML (coinciding with the line B-B in this case), which is indicated by the chain line in FIG. 8 and FIG. 9, the pattern shapes are set such that the width dimension of a gap d (hereinafter referred to as the "interval dimension") in the direction along the molding line ML (the gap being produced between five wiring patterns HP1 through HP5 shown in FIG. 11) ranges from 50% to 200% of the interval of an adjacent wiring interval.

For example, in the case of the example shown in FIG. 11, if the thickness of the wiring patterns HP1 through HP5 is 25 μm and the wiring width is 70 μm, and the thickness of the solder resist 115 applied and formed thereon is about 25 μm, then the interval dimension d of the wiring patterns HP1 through HP5 will be about 0.07 to about 0.3 mm. Furthermore, considering the error of the accuracy of positioning a metal mold at the time of molding, the pattern shapes are designed such that the interval dimension d of the wiring patterns HP1 through HP5 ranges from 50% to 200% in the molding line area MLA having a width of about 0.4 mm, including a design position of the molding line ML. It is required that the total length of the wiring patterns HP be minimized. If, however, the wiring patterns HP need to be curved, then the linear portions thereof are made as long as possible.

Adjacent wiring intervals are set to range from 50% to 200%, and the intervals are successively changed. In other words, if an interval exceeding 200% locally exists, then major leakage of a resin will occur at that particular spot, whereas small leakage of the resin occurs evenly when adjacent wiring intervals successively differ within the range of 50% to 200%. Hence, no major resin leakage will result, thus restraining the occurrence of poor connection of solder balls or disconnection of wiring layers.

Figure 12:
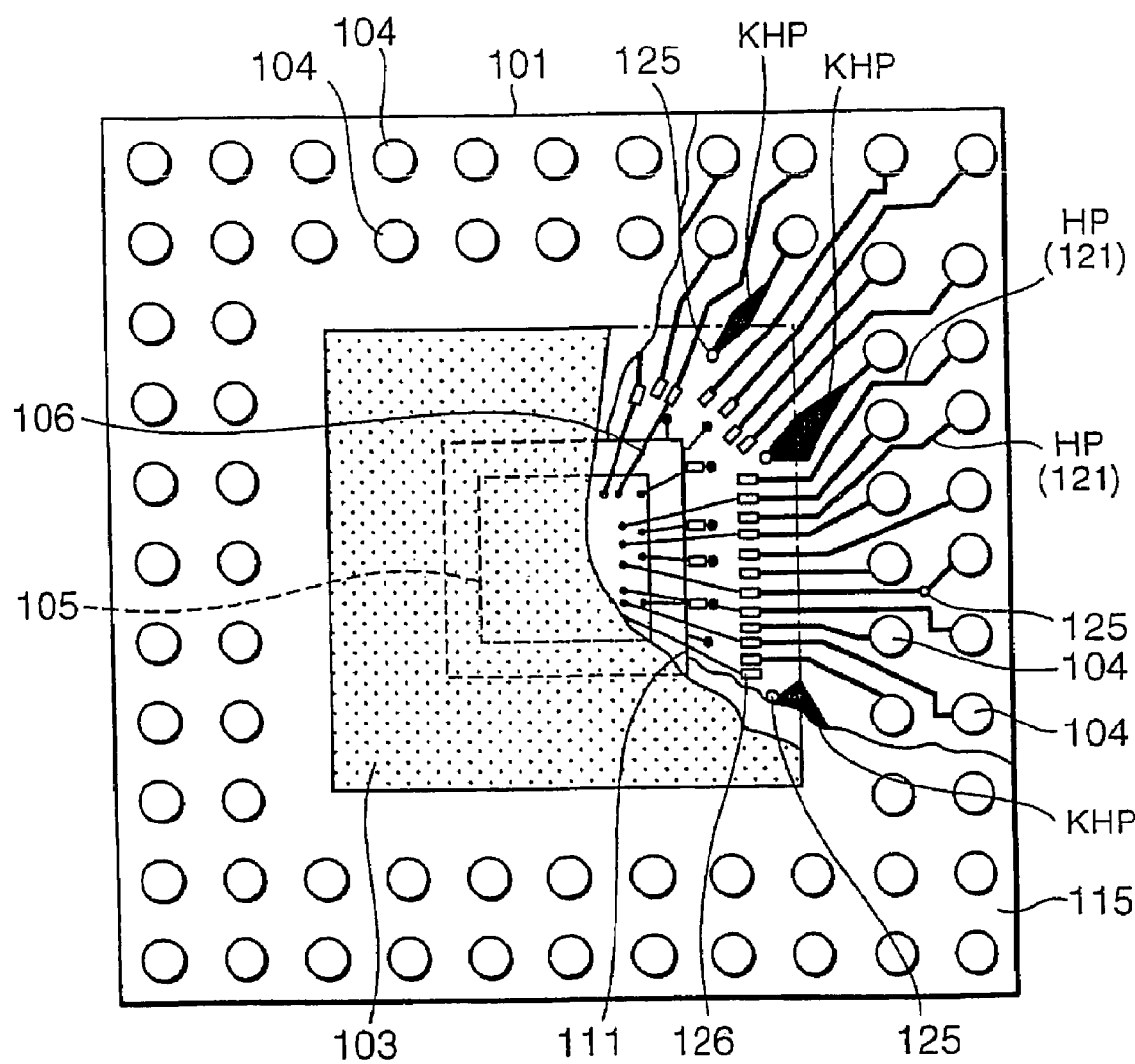
FIG. 12 is a plan view of a second embodiment of the semiconductor device in accordance with the present invention.

A second embodiment in accordance with the present invention will now be explained in detail with reference to FIG. 12. Referring to FIG. 12, the wires do not necessarily have the same wire width. In general, a multi-pin semiconductor device has numerous signal wires having a uniform, narrow wire width. On the other hand, there are only a few power wires and ground (GND) wires, which have larger wire widths that are not uniform. Fixed potential wires KHP, such as the power wires and the GND wires, are pulled out by bonding wires onto the bonding pads 126 from power terminals and GND terminal on the semiconductor chip 105, and connected to lower wiring layers via the through holes 125. Furthermore, the fixed potential wires KHP are routed from the lower wiring layers via the through holes 125 again to be connected to the wires of the uppermost layer so as to be connected to the solder balls 104 serving as external terminals. If the through holes 125 for the connection to the uppermost layer are provided on a side closer to the semiconductor chip beyond the molding line ML, then the fixed potential wires KHP, such as the power wires and the GND wires, cross the molding line. In this case, the widths of the wires KHP crossing the molding line are not necessarily even. However, adjacent wiring intervals are set to range from 50% to 200%, as in the case of the first embodiment. Accordingly, since the adjacent wiring intervals successively change, no major resin leakage will occur, restraining the occurrence of poor connection of the solder balls or disconnection of the wiring layers.

Figure 13:
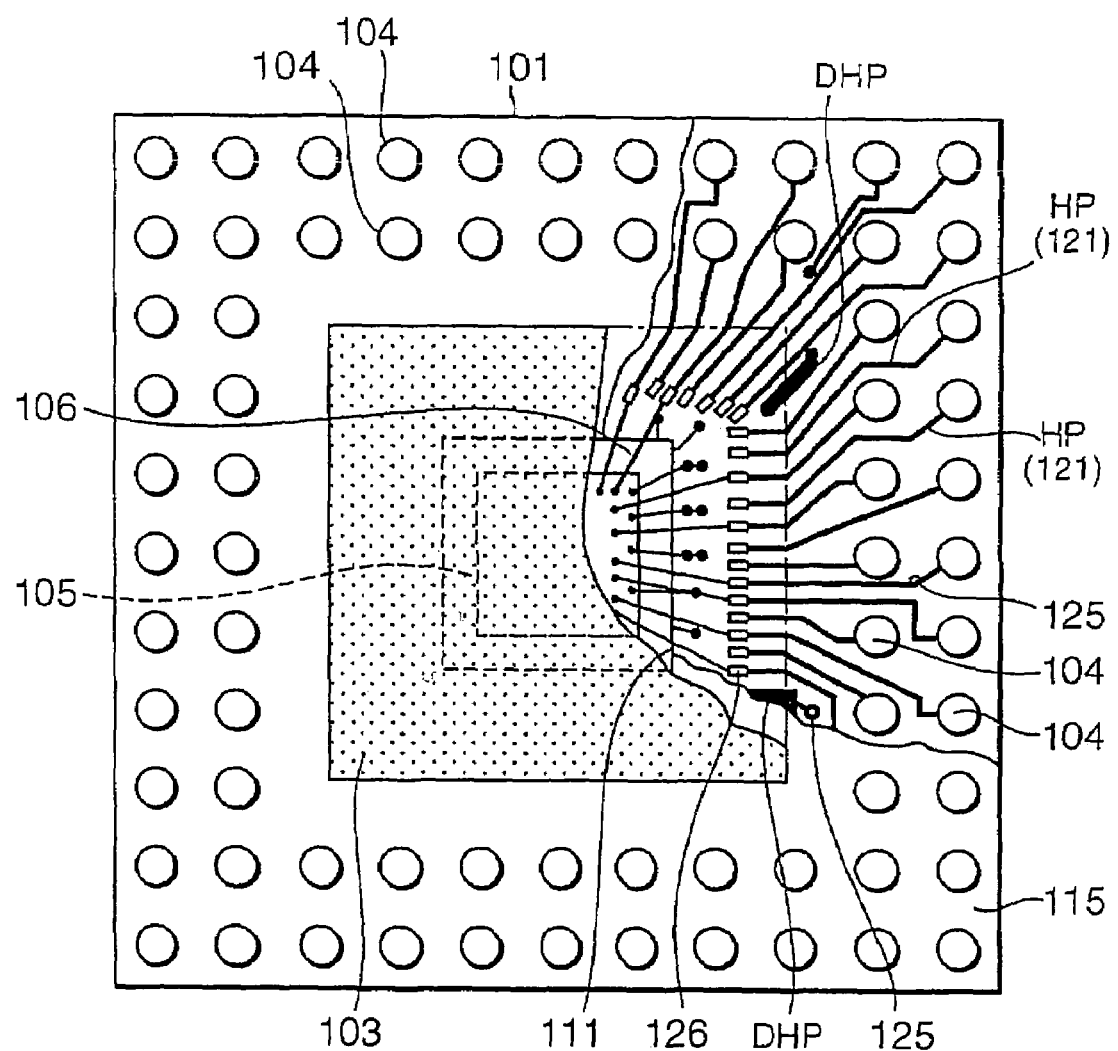
FIG. 13 is a plan view of a third embodiment of the semiconductor device in accordance with the present invention.

A third embodiment in accordance with the present invention will be described in detail with reference to relevant drawings. Referring to FIG. 13, the density of wiring patterns HP is low in the area wherein the number of the wiring patterns HP per unit area is small, as in the four-side area of the circuit board 101, and it is difficult to dispose the wiring patterns HP at the aforesaid interval dimension d. For this reason, a dummy wiring pattern DHP is formed between the wiring patterns HP so as to set the interval dimension d between the dummy wiring pattern DHP and the wiring pattern HP to 50% to 200% of an adjacent wiring interval at least in the molding line area MLA.

The dummy wiring patterns DHP are electrically connected to a power wiring layer of the third wiring layer 123 or a ground wiring layer or the like of the fourth wiring layer 124 via the through holes 126 to maintain a fixed potential state. The dummy wiring pattern DHP may be formed to be a wiring pattern with a large width, as shown in FIG. 13, or may be a set of a plurality of thin wiring patterns.

The KHP fixed potential wire and the dummy wiring pattern DHP are different in that the fixed potential wire is the wire for connecting the semiconductor chip 105 and the solder balls 104, while the dummy wiring pattern has one end thereof connected to the fixed potential wire KHP, but has the other end thereof floating. If no terminal of the dummy wiring pattern DHP is connected, placing the terminals in an electrically floating state, then noises may be produced in a wiring pattern HP due to a parasitic capacitance or the like existing between the dummy wiring pattern DHP and the wiring pattern HP.

It may be considered possible to set the interval dimension to 50% to 200% of an adjacent wiring interval by partially increasing the width of the wiring pattern HP in the molding line area MLA without forming the dummy wiring pattern DHP. This, however, disturbs the current passing through the wiring pattern HP at the portion where the width has been increased, leading to the occurrence of noises.

Figure 14:
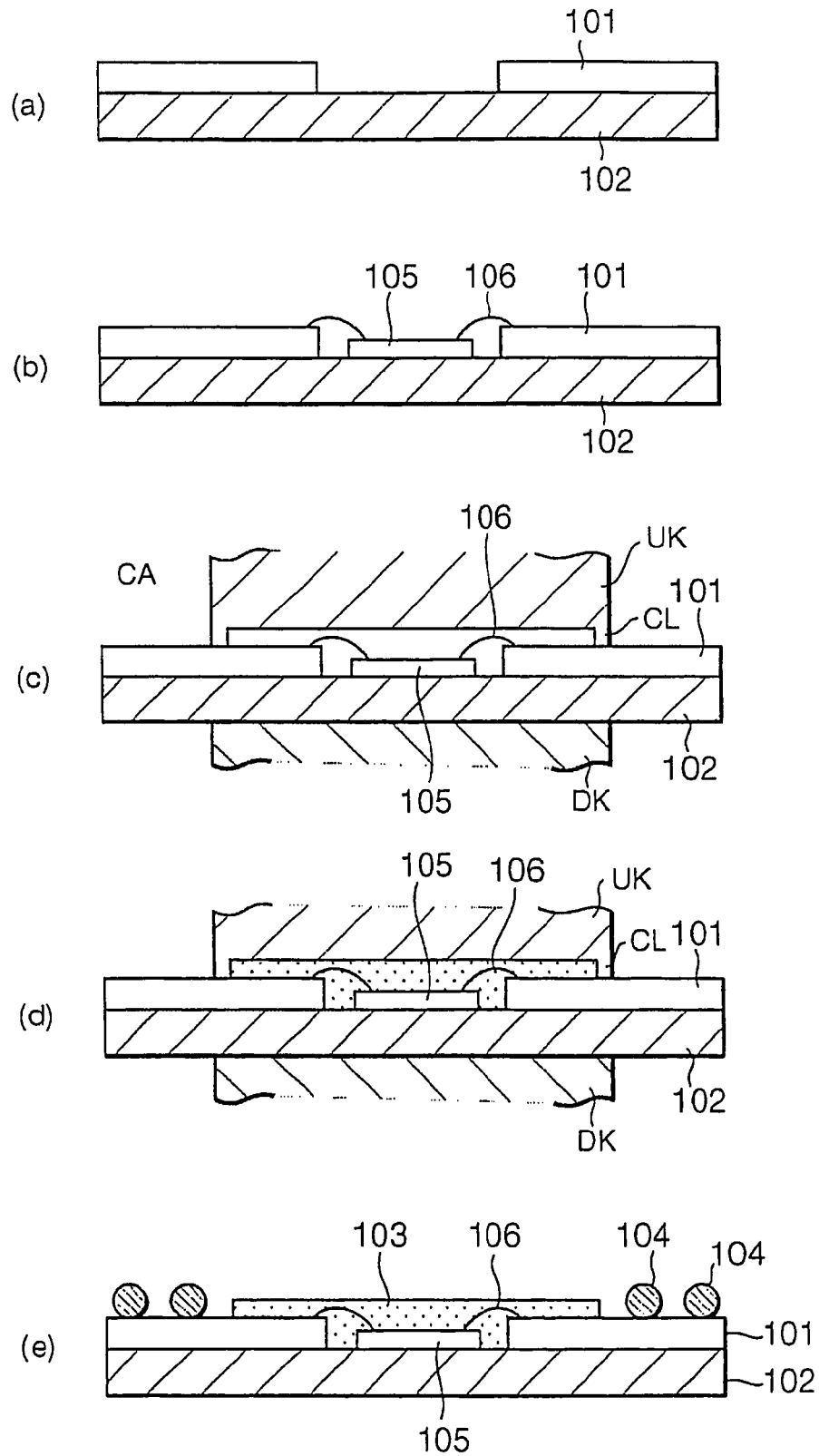
FIG. 14(a) to (e) are a diagram illustrating a manufacturing process of the semiconductor device shown in FIG. 7.

The manufacturing process of the ABGA type semiconductor device described in the first through third embodiments in accordance with the present invention will now be explained with reference to FIG. 14. First, as shown in FIG. 14A, the circuit board 101 is attached to the rear surface, that is, the front surface of the heat spreader 102 at the side of the fourth wiring layer 124 by an adhesive agent 131. At this time, an electrically conductive adhesive agent may be used as the adhesive agent 131 to electrically connect the fourth wiring layer 124 formed as the ground wiring layer to the heat spreader 102 thereby to fix the heat spreader to the ground potential.

Then, as shown in FIG. 14B, the semiconductor chip 105 is mounted on the front surface of the heat spreader 102 exposed in the opening 111 of the circuit board 101 by using an adhesive agent or a brazing material 132. Then, an electrode pad 141 formed on the front surface of the semiconductor chip 105 and the bonding pads 126 of the circuit board 101 are interconnected by bonding wires 106 to electrically connect the semiconductor chip 105 to the wiring patterns HP of the circuit board 101.

Subsequently, as shown in FIG. 14D, the sealing resin 103 is molded in the area that includes the semiconductor chip 105 and the bonding wires 106. Thus, the sealing resin 103 seals the area that includes the semiconductor chip 105, the bonding wires 106, and the bonding pads 126 of the circuit board 101.

Figure 1:
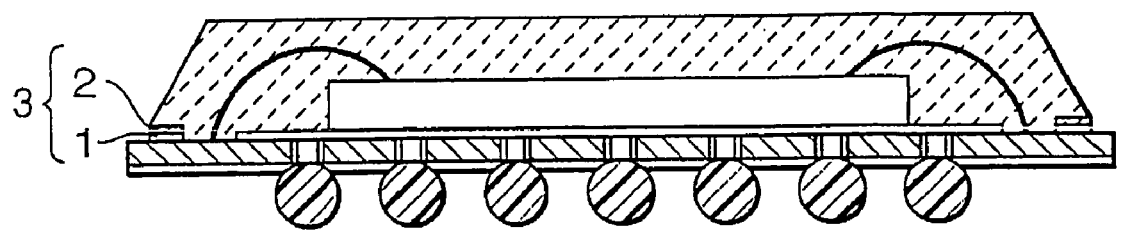
FIG. 1 is a sectional view of a first example of a conventional semiconductor device.
Figure 2:
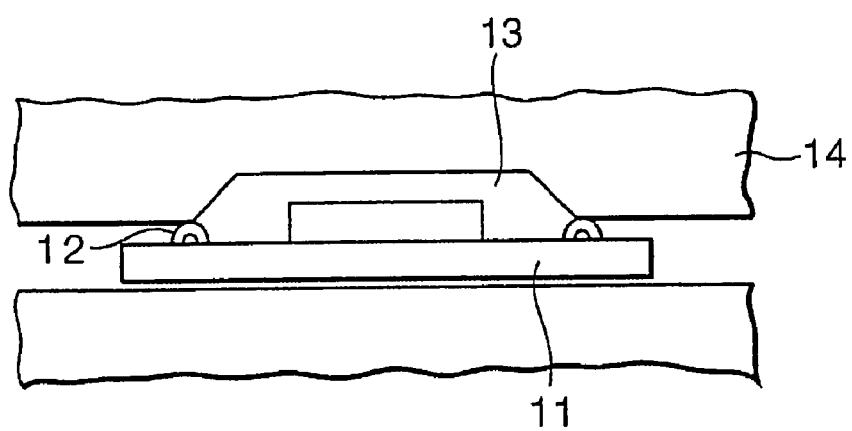
FIG. 2 is a sectional view of a second example of a conventional semiconductor device.
Figure 3:
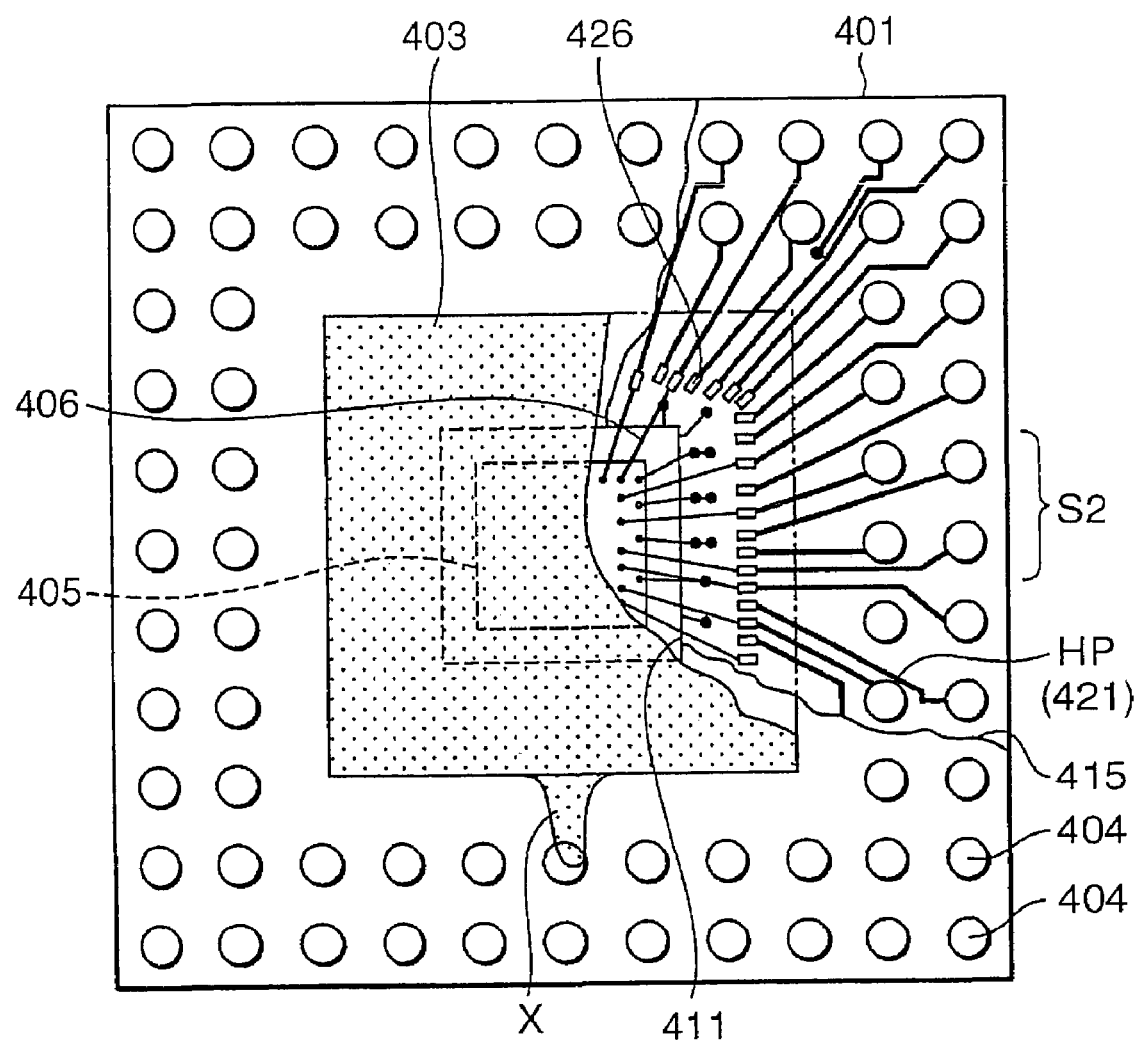
FIG. 3 is a partly cutaway plan view of a third example of a conventional semiconductor device.
Figure 4:
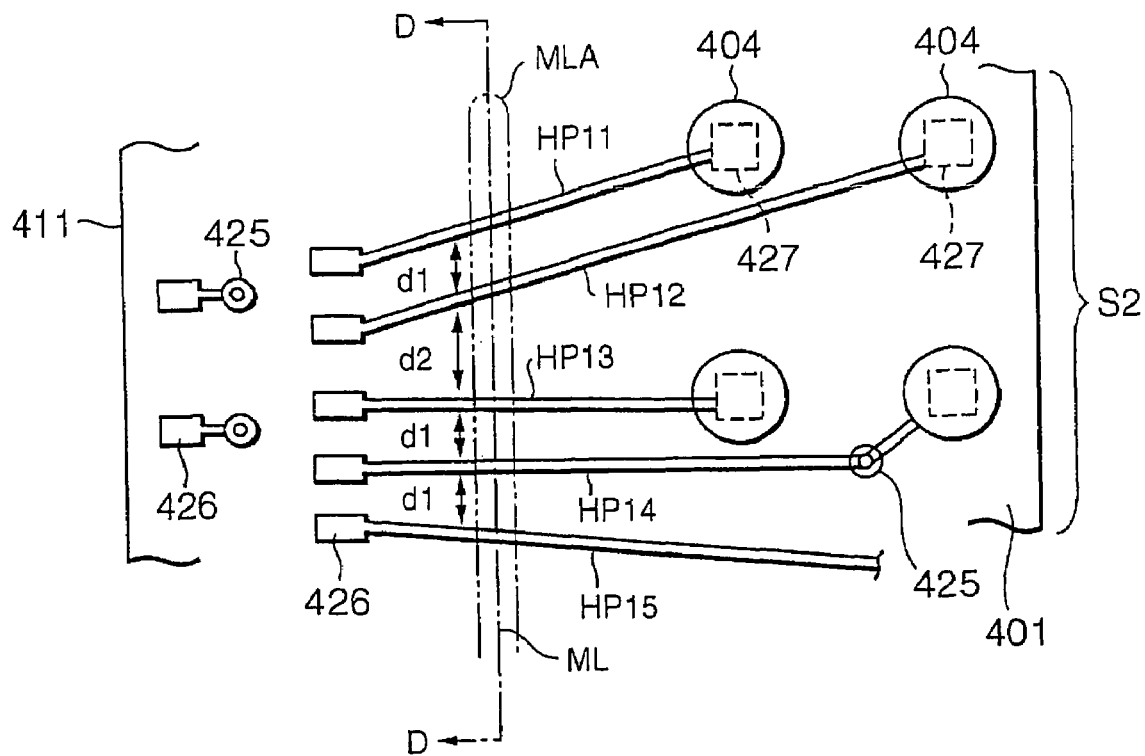
FIG. 4 is an enlarged plan view of an area S2, which is a part of the semiconductor device shown in FIG. 3.
Figure 5:
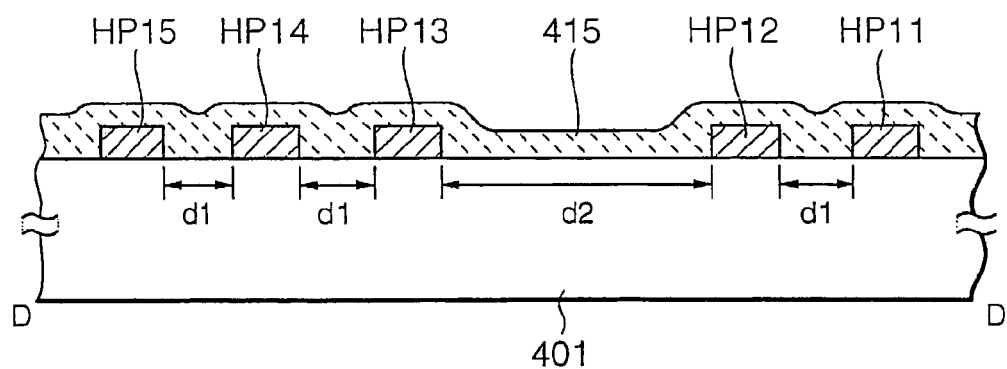
FIG. 5 is an enlarged sectional view taken at the line D-D shown in FIG. 4.
Figure 6:
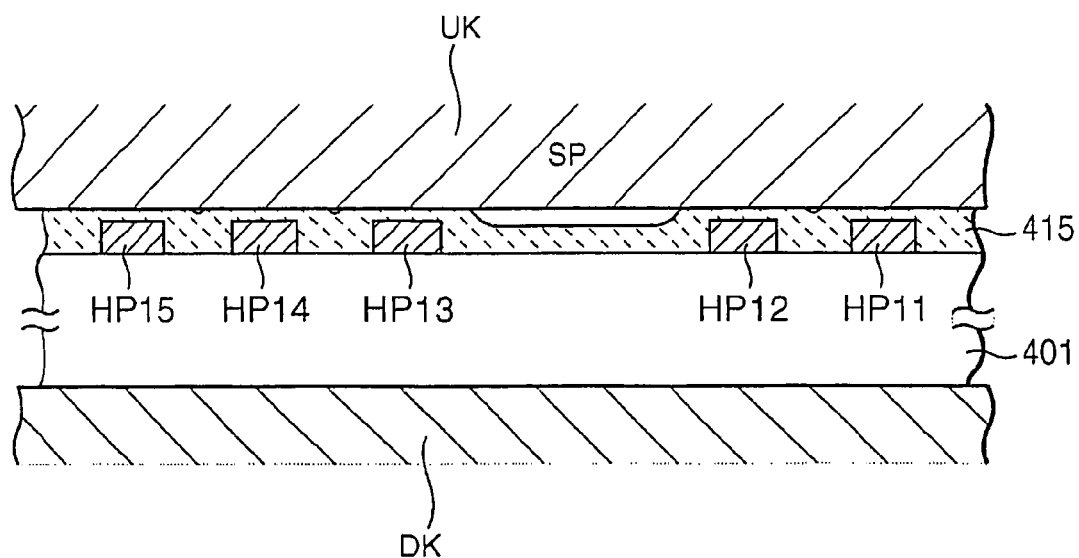
FIG. 6 is a sectional view illustrating a state wherein a sealing resin is being formed, the sectional view being similar to that of FIG. 5 except that a part thereof has been omitted.
Figure 15:
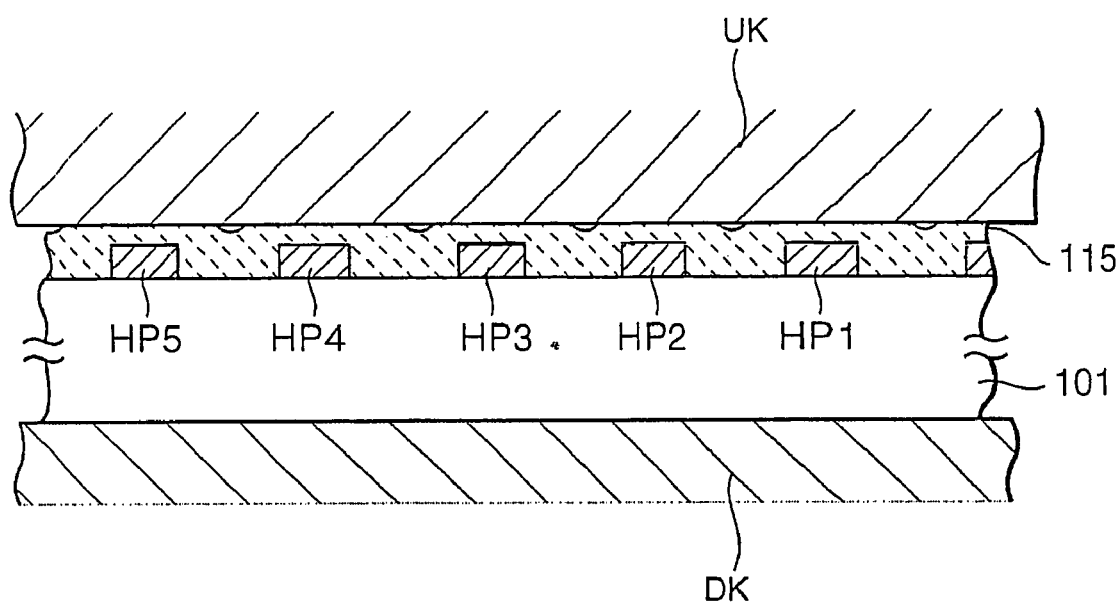
FIG. 15 is a sectional view illustrating a state wherein a sealing resin is being formed in the semiconductor device shown in FIG. 7, the sectional view being similar to that of FIG. 11 except that a part thereof has been omitted.

To mold the sealing resin 103, the semiconductor device fabricated in the process described above is rested on the drag DK of a resin molding apparatus, and the cope UK is moved down to clamp the semiconductor device between the cope and the drag. A cavity CA having a shape for the sealing resin is formed in the bottom surface of the cope UK. The area along the outer periphery of the cavity CA is formed as a clamping portion CL that can be abutted against the upper surface of the circuit board 101. Hence, when the cope UK is abutted against the upper surface of the circuit board 101 at the molding line area MLA, the clamping force of the cope and the drag causes the clamping portion CL to slightly crush the surface of the solder resist 115 in the molding line area MLA. At this time, the marked concaves observed with the prior art shown in FIG. 5 will not be produced on the surface of the solder resist 115 among the wiring patterns HP1 through HP 5, and no such gap shown in FIG. 6 will be produced between the abutting surface of the clamping portion CL and the surface of the solder resist 115. This is because the wiring patterns HP1 through HP5 are formed with the intervals d, which range from 50% to 200% of adjacent wiring intervals, in the molding line area MLA, as illustrated in the enlarged view of FIG. 15 showing the condition of the same area as that shown in FIG. 11. In this case, very small concaves are observed on the surface of the solder resist 115 among the wiring patterns HP1 through HP5. However, no such gap is formed due to the crushed surface of the solder resist 115 caused by the clamping portion CL mentioned above.

Thus, as shown in FIG. 14D, when the sealing resin 103 is injected into the cavity of the metal mold to seal, with the resin, the area including the semiconductor chip 105, the bonding wires 106, and the bonding pads 126 of the circuit board 101, that is, the area enclosed by the molding line ML, the sealing resin 103 will not leak out from between the clamping portion CL and the front surface of the circuit board 101, making it possible to restrain the occurrence of resin burrs. Moreover, although the clamping force of the metal mold causes a load to be applied to the wiring patterns HP in the area near the molding line ML, the wiring patterns HP, which are formed to have uniform interval dimensions in the molding line area MLA, cause the load to be scattered and applied evenly to the wiring patterns HP. This arrangement restrains a reduction in the thickness or disconnection of the wiring patterns HP caused by the wiring patterns HP being crushed in the area near the molding line ML, permitting higher reliability of the circuit board to be achieved.

Thereafter, as shown in FIG. 14E, the solder balls 104 are formed on ball pads 127 arranged around the circuit board 101. The solder balls 104 are formed by, for example, a technique in which a flux is applied to the front surface of the circuit board 101, the solder balls are mounted on the ball pads 127, reflowing is carried out to form the solder balls 104, and the flux is removed. This will electrically connect the semiconductor chip 105 to the solder balls 104 through the wiring patterns HP of the first wiring layer 121, thus making the ABGA type semiconductor device shown in FIG. 7 to be fabricated. The arrangement restrains resin burrs attributable to the leakage of the sealing resin 103 from being formed outside the molding line area MLA, so that the surfaces of the ball pads 127 will be free of resin burrs. Therefore, the adhesion between the solder balls 104 and the ball pads 127 can be enhanced, and the occurrence of defective solder balls can be restrained, allowing higher reliability of the semiconductor device to be achieved.

Figure 16:
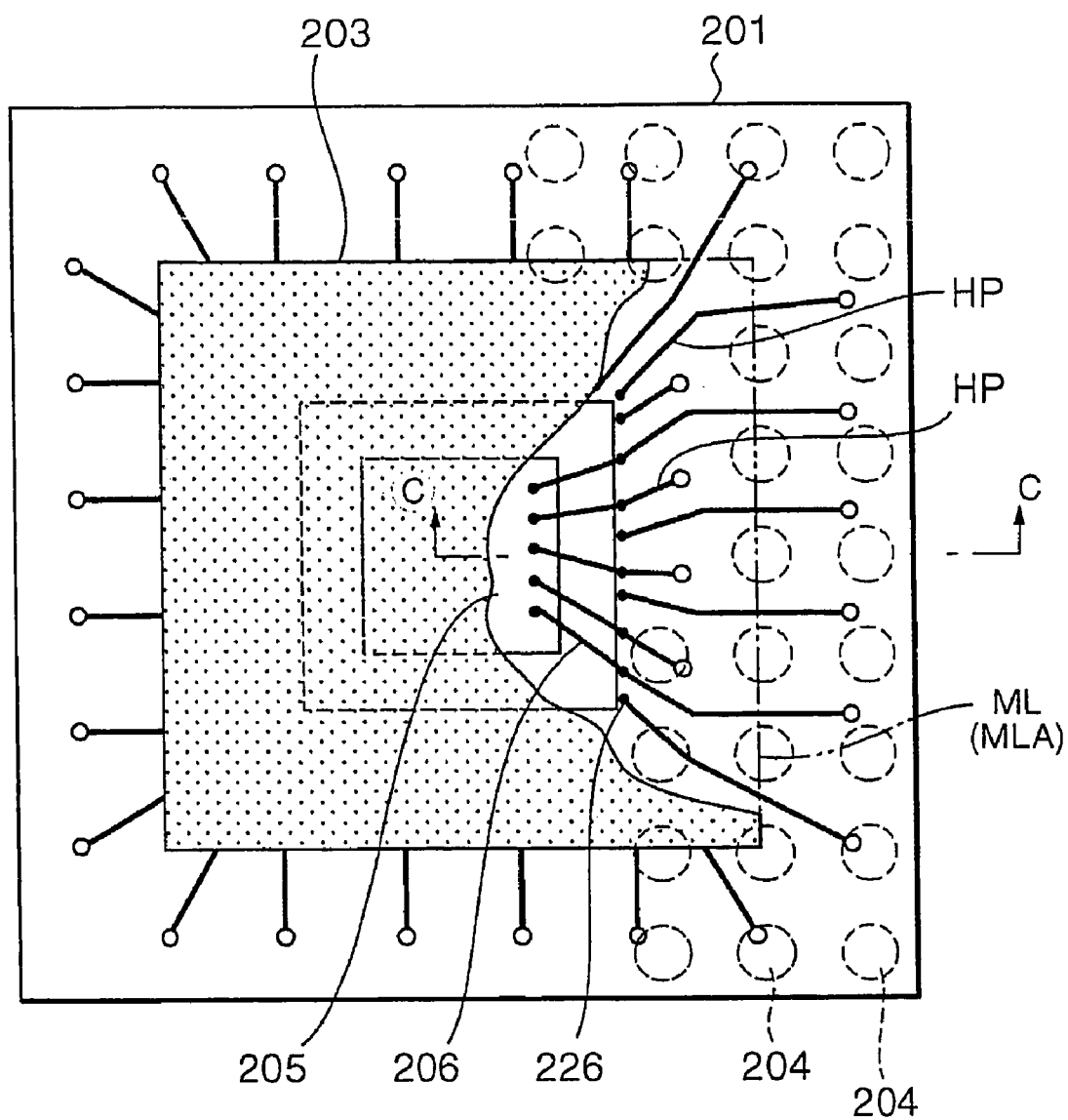
FIG. 16 is a plan view of a fourth embodiment of the semiconductor device in accordance with the present invention.
Figure 17:
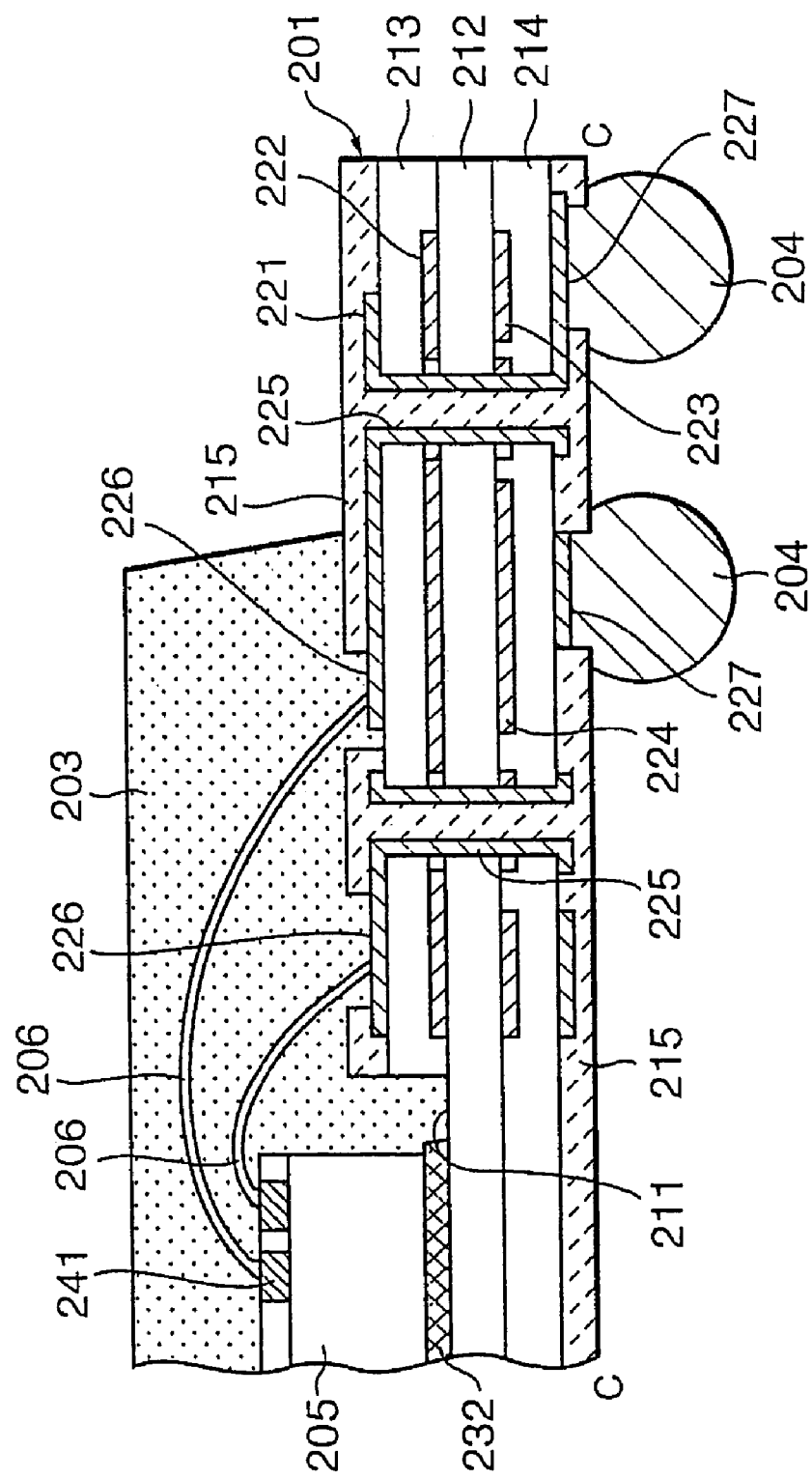
FIG. 17 is an enlarged sectional view taken at the line C-C shown in FIG. 16.

A fourth embodiment of the present invention will now be described. FIG. 16 is a partly cutaway plan view of the fourth embodiment in which the present invention has been applied to a BGA semiconductor device, and FIG. 17 is an enlarged sectional view of the area in the vicinity of the line C-C shown in FIG. 16.

In the BGA semiconductor device shown in FIG. 16, a semiconductor chip 205 is mounted in the central area of the upper surface of the a circuit board 201, and electrically connected to the wiring layers formed on the circuit board 201. A sealing resin 203 molded on the circuit board 201 seals the semiconductor chip 205, etc. On the rear surface of the circuit board 201, a number of solder balls 204 are arranged in a grid pattern.

To make the circuit board 201, a plurality of circuit boards (each being as shown in FIG. 16) are first formed in a state wherein they are linked in a planar direction, then they are cut and separated into individual circuit boards in the last step of a manufacturing process. If a resin burr from the sealing resin 203 is present at a cutting and separating place of the circuit board 201, i.e., on the outer peripheral edge of the circuit board 201, then the resin burr makes it difficult to perform smooth cutting and separation of the circuit board 201, leading to a crack or chip in the outer peripheral edge of the circuit board 201. If the crack or chip reaches a wiring layer, then the reliability of the wiring layer is likely to be adversely affected. In addition, the appearance of the semiconductor device may be impaired, leading to degraded quality of the product.

The BGA type semiconductor device is mounted on a printed circuit board (not shown) by a surface mounting process, in which the rear surface with solder balls 204 formed thereon is disposed to oppose the front surface of the printed circuit board, and the solder balls 204 are heated to melt them so as to connect them to wiring patterns of the printed circuit board.

The circuit board 201 is formed to have a predetermined planar shape and provided with wiring layers formed on at least the front surface and the rear surface thereof, respectively. As shown in FIG. 17, this embodiment has the four wiring layers as in the case of the above embodiments. Wiring layers 222 and 223 having thin metal films formed into patterns by lithography are attached to both surfaces of a core 212 composed of an insulating plate. Furthermore, wiring layers 221 and 224 having thin metal films formed into patterns by lithography are formed on the wiring layers 222 and 223 through the intermediary of prepregs 213 and 214, which are made of thin resin films.

Thus, a total of four wiring layers are formed at top and bottom so that they are insulated against each other, the core 212 and the prepregs 213 and 214 being interleaved thereamong. The first wiring layer 221, the second wiring layer 222, the third wiring layer 223, and the fourth wiring layer 224 are stacked in this order from the top. A concave portion 211 is formed in the central area of the front surface of the core 212, the prepreg 213 being not formed in the central area. Of the wiring layers, the uppermost first wiring layer 221 is configured as a signal wiring layer, the second wiring layer 222 is configured as a power wiring layer, the third wiring layer 223 is configured as a ground wiring layer, and the fourth wiring layer 224 on the rear surface is configured as a pad wiring layer.

The through holes 225 are provided at predetermined locations of the circuit board 201, and the first through fourth wiring layers 221 through 224 are electrically interconnected. Furthermore, a solder resist 215 made of an insulating material is applied to the front and rear surfaces of the circuit board 201 to insulatively protect the surfaces of the first wiring layer 221 and the fourth wiring layer 224.

Referring to FIG. 16, the first wiring layer 221 is formed of a large number of short or long narrow wiring patterns HP extended from one end of each, which is disposed on a peripheral edge of the concave portion 211 in the central area of the circuit board 201, toward the other end of each and toward the peripheral direction of the circuit board.

As in the case of the embodiments above, the solder resist 215 is removed from the surface of one end of each of the wiring patterns HP to expose the wiring pattern so as to provide a bonding pad 226. The other end of each of the wiring patterns HP is electrically connected to a lower wiring layer via the through hole 225 at an appropriate position. The fourth wiring layer 214 functioning as the pad wiring layer is connected via the through holes 225 to the first wiring layer 221 or the second and third wiring layers 222 and 223. As in the case of the above embodiments, one end of each of the wiring patterns HP of the fourth wiring layer 214 is formed to have a larger wire width and arranged in a grid pattern. The solder resist 215 is removed the end to expose the surface so as to provide a ball pad 227.

As in the case of the first embodiment, the numerous wiring patterns HP are extensively disposed such that the linear portions thereof are extended as much as possible between the bonding pads 226 and the other ends in the area in the vicinity of the periphery where the through holes 225 are formed. At a molding line ML along the outer peripheral edge of the sealing resin 203 on the circuit board 201 or in a molding line area MLA, the wiring patterns are shaped such that the dimensions of the intervals among the numerous wiring patterns HP in the direction along the molding line are uniform, as shown in FIG. 16.

Although it is not shown in this embodiment, as in the case of the above embodiments, if the number of arranged wiring patterns HP per unit area on the circuit board 201 is small, which means the density of the wiring patterns is low, making it difficult to dispose the wiring patterns at the aforesaid interval dimension, then dummy wiring patterns may be formed among the wiring patterns HP, and the interval dimension between the dummy wiring pattern and the wiring pattern at least in the molding line area may be set to the aforesaid uniform dimension. In this case, preferably, the dummy wiring patterns are electrically connected to the power wiring layer of the second wiring layer 222 or the ground wiring layer or the like of the third wiring layer 223 via the through holes to maintain the fixed potential condition, as in the case of the above embodiments.

In the circuit board 201 having the configuration set forth above, a semiconductor chip 205 is mounted with an adhesive agent 232 on the front surface of the core 212 in the concave 211 of the central area. Then, electrode pads 241 formed on the front surface of the semiconductor chip 205 and the bonding pads 226 of the circuit board 201 are interconnected by the bonding wires 206. Then, the sealing resin 203 is molded in the area that includes the semiconductor chip 205 and the bonding wires 206, thereby sealing, by the sealing resin 203, the area of the semiconductor chip 205, the bonding wires 206, and the bonding pads 226 of the circuit board 201.

To mold the sealing resin 203, as in the case of the above embodiments, the semiconductor device produced in the process described above is rested on a drag of a resin molding apparatus, and a cope is moved down to clamp the semiconductor device between the cope and the drag. The construction of the metal mold is the same as that in the above embodiments. Hence, when the cope is abutted against the upper surface of the circuit board at the molding line area, the clamping force of the cope and the drag causes the clamping portion to slightly crush the surface of the solder resist 215 in the molding line area MLA. At this time, no such gap will be produced between the abutting surface of the clamping portion and the surface of the solder resist 215, as in the case of the above embodiments. This is because the wiring patterns HP are formed such that adjacent wiring intervals range from 50% to 200% in the molding line area MLA. When the sealing resin is injected into the cavity of the metal mold to seal the area enclosed by the molding line ML with the resin, the sealing resin 203 will not leak out to the peripheral portion of the circuit board 201 from between the clamping portion and the front surface of the circuit board 201, making it possible to restrain the occurrence of resin burrs.

Moreover, although the clamping force of the metal mold causes a load to be applied to the wiring patterns HP in the area near the molding line ML, the wiring patterns HP, which are formed to have uniform interval dimensions in the molding line area MLA, cause the load to be scattered and applied practically evenly to the wiring patterns HP. This arrangement restrains a reduction in the thickness or disconnection of the wiring patterns HP caused by the wiring patterns HP being crushed in the area near the molding line ML, permitting higher reliability of the circuit board 201 to be achieved.

Thereafter, the solder balls 204 are formed on ball pads 227 arranged on the rear surface of the circuit board 201. The solder balls 204 are formed by, for example, a technique in which a flux is applied onto the circuit board 201, the solder balls are mounted on the ball pads 227, reflowing is carried out to form the solder balls 204, and the flux is removed, as in the case of the above embodiments. This will electrically connect the semiconductor chip 205 to the solder balls 204 through the intermediary of the first wiring layer 221, the through holes 225, and the fourth wiring layer 224, thus making the BGA type semiconductor device to be fabricated. Thereafter, a step for cutting and separating circuit boards is carried out to cut and separate a plurality of semiconductor devices, which have a plurality of circuit boards thereof formed in a connected state, into individual semiconductor devices. The cutting and separating step can be implemented without causing a crack or chip at the cutting places of the circuit board 201 because of the absence of resin burrs from the sealing resin 203 at the cutting places of the circuit board 201. This allows a semiconductor device with higher reliability to be produced.

The configuration of the semiconductor device in accordance with the present invention is not limited to the configurations of the embodiments described above. The present invention can be applied to any semiconductor devices in which the wiring layer formed on a surface of a circuit board is partly sealed by molding a sealing resin. For example, the present invention can be applied to a semiconductor device having a circuit board formed of a tape or the like in which the front surface of an insulating plate is provided with a surface wiring layer on the front surface thereof and a ground wiring layer on the rear surface thereof, the front surface being insulatively protected by a solder resist. In this semiconductor device, a concave portion is formed in the central area of the circuit board, and a semiconductor chip is mounted therein with an adhesive agent. In this case, the semiconductor chip and the bonding pads of the surface wiring layer of the circuit board are electrically connected by bonding wires, then a sealing resin is molded over the concave portion and the area around the concave portion to seal the semiconductor chip and the bonding wires. Furthermore, solder balls are formed on the ball pads provided on the surface wiring layer on the front surface of the circuit board in the outer peripheral area of the sealing resin. In this semiconductor device, setting the intervals in the surface wiring layer in a sealing resin molding line area to 50% to 200% of the intervals of adjacent wires will restrain the sealing resin from leaking out to the ball pads. It is therefore possible to restrain resin burrs from being formed, and also restrain disconnection or the like in the surface wiring layer, thus allowing a highly reliable semiconductor device to be obtained. As necessary, a configuration may be adopted wherein a dummy wiring layer is formed between wiring layers of the circuit board so as to obtain even intervals of the wiring layers, and the dummy wiring layer is electrically connected to a ground wiring layer on the rear surface of the circuit board via through holes.

As set forth above, in the semiconductor device according to the present invention, a sealing resin is molded to seal a semiconductor chip on a circuit board that has a plurality of wiring patterns formed on a front surface thereof and a solder resist layer for insulatively covering the wiring patterns. The intervals of adjacent wiring patterns in the area around the periphery of the sealing resin are set such that they range from 50% to 200%. Hence, among a plurality of wiring patterns, a gap will not be produced between the circuit board and a metal mold abutted against the front surface of the circuit board when the sealing resin is molded. This practically prevents the sealing resin from leaking out from between the metal mold and the front surface of the circuit board. Hence, it is possible to reduce resin burrs, ideally form solder balls in an area around the outer periphery of the sealing resin, or easily cut and separate circuit boards.

Moreover, when a load from the clamping force of the metal mold is applied to the wiring patterns in a molding line area, the applied load is evenly scattered with respect to the wiring patterns. This arrangement protects the wiring patterns from being crushed and disconnected by the metal mold.

The invention claimed is:

1. A semiconductor device comprising:
   a circuit board having an opening, said opening having an edge line to define an outer shape thereof;
   a semiconductor chip mounted in said opening, said semiconductor chip including at least one corner portion and a plurality of electrodes;
   a plurality of wiring patterns formed on said circuit board, each of said wiring patterns including a pad which is electrically connected to an associated one of said electrodes of said semiconductor chip and a conductive line elongated from said pad in a direction opposite to said semiconductor chip; and
   a sealing resin formed to encapsulate said semiconductor chip together with said pad and a part of said conductive line of each of said wiring patterns, said sealing resin having a molding line to define an outer shape thereof, said conductive line of each of said wiring patterns thereby crossing said molding line of said sealing resin, said molding line of said sealing resin having a corner that corresponds to said corner portion of said semiconductor chip, said sealing resin being larger in size than said opening so that said molding line positions on said circuit board beyond said edge line of said opening,
   wherein said wiring patterns include a first set of wiring patterns arranged near to said corner of said molding line of said sealing resin and a second set of wiring patterns arranged apart from said corner of said molding line of said sealing resin, said conductive line of each of said first set of wiring patterns obliquely crossing said molding line of said sealing resin and said conductive line of said second set of wiring patterns substantially perpendicularly crossing said molding line of said sealing resin so that respective gaps along said molding line of said sealing resin between adjacent wiring patterns among said first set of wiring patterns and respective gaps along said molding line of said sealing resin between adjacent wiring patterns among said second set of wiring patterns are approximately equal to one another.

2. The device as claimed in claim 1, wherein said circuit board includes a heat spreader, a part of said heat spreader exposed by said opening, said semiconductor chip being mounted on said part of said heat spreader exposed by said opening.

3. The device as claimed in claim 2, wherein each of said pad and said conductive line of each of said wiring patterns is formed on a front surface of said circuit board, said circuit board further including a plurality of terminal electrodes formed on said front surface of said circuit board, said conductive line of each of said wiring patterns being elongated from said pad of an associated one of said wiring patterns and reaching an associated one of said terminal electrodes.

4. The device as claimed in claim 1, wherein each of said pad and said conductive line of each of said wiring patterns is formed on a front surface of said circuit board, said circuit board including a plurality of terminal electrodes formed on a rear surface of said circuit board and a plurality of through holes, said conductive line of each of said wring patterns being elongated from said pad of an associated one of said wiring patterns and reaching an associated one of said terminal electrodes via an associated one of said through holes.

5. The device as claimed in claim 1, wherein a gap along said molding line of said sealing resin between a most outward one of said first set of wiring patterns and one of said second set of wiring patterns adjacent to said most outward one is approximately equal to the other gaps.

6. The device as claimed in claim 1, wherein said conductive line of each of said wiring patterns is covered with a solder resist film.

7. The device as claimed in claim 1, wherein said circuit board includes a heat spreader.

* * * * *